US012557350B2

(12) United States Patent
Matsuura

(10) Patent No.: US 12,557,350 B2
(45) Date of Patent: Feb. 17, 2026

(54) FIELD-EFFECT TRANSISTOR AND METHOD FOR MANUFACTURING SAME

(71) Applicant: DENSO CORPORATION, Kariya (JP)

(72) Inventor: Yuichiro Matsuura, Kariya (JP)

(73) Assignee: DENSO CORPORATION, Kariya (JP)

( * ) Notice: Subject to any disclaimer, the term of this patent is extended or adjusted under 35 U.S.C. 154(b) by 332 days.

(21) Appl. No.: 18/461,679

(22) Filed: Sep. 6, 2023

(65) Prior Publication Data
US 2023/0411449 A1 Dec. 21, 2023

Related U.S. Application Data

(63) Continuation of application No. PCT/JP2022/001571, filed on Jan. 18, 2022.

(30) Foreign Application Priority Data

Jun. 11, 2021 (JP) ................. 2021-098031

(51) Int. Cl.
*H10D 62/10* (2025.01)
*H01L 21/265* (2006.01)
*H01L 21/266* (2006.01)
*H10D 30/66* (2025.01)

(52) U.S. Cl.
CPC ...... *H10D 62/111* (2025.01); *H01L 21/26513* (2013.01); *H01L 21/266* (2013.01); *H10D 30/668* (2025.01); *H10D 62/127* (2025.01)

(58) Field of Classification Search
CPC .. H10D 62/111; H10D 30/668; H10D 62/127; H10D 30/021; H10D 30/0297; H10D 30/60; H10D 62/107; H10D 62/157; H01L 21/26513; H01L 21/266
USPC .......................................... 257/330
See application file for complete search history.

(56) References Cited

U.S. PATENT DOCUMENTS

| 7,872,308 | B2 * | 1/2011 | Akiyama ............. H10D 62/393 |
| | | | 257/349 |
| 12,040,361 | B2 * | 7/2024 | Okumura ........... H10D 30/0297 |
| 2007/0181939 | A1 | 8/2007 | Huang et al. |
| 2009/0200559 | A1 | 8/2009 | Suzuki et al. |
| 2011/0291110 | A1 | 12/2011 | Suzuki et al. |
| 2014/0361398 | A1 | 12/2014 | Higashida |

(Continued)

FOREIGN PATENT DOCUMENTS

| CN | 1855546 A | * 11/2006 | |
| CN | 105977302 A | * 9/2016 | ........... H10D 62/124 |

(Continued)

*Primary Examiner* — Mohammad M Hoque
(74) *Attorney, Agent, or Firm* — Posz Law Group, PLC

(57) ABSTRACT

A field-effect transistor includes: a semiconductor substrate having trenches; and a gate electrode disposed in the trenches. Breakdown voltage regions are provided in each inter-trench range. The breakdown voltage regions are arranged to form rows extending in a first direction intersecting the trenches. The rows are arranged at interval in a second direction parallel to the trenches. Each of the breakdown voltage regions extends from an upper side of a lower end of each of the trenches to a lower side of the lower end of each of the trenches, and is disposed at a distance from a gate insulating film. A drift region is in contact with the gate insulating film at a position between the breakdown voltage region and the gate insulating film.

5 Claims, 18 Drawing Sheets

(56) References Cited

U.S. PATENT DOCUMENTS

| | | | |
|---|---|---|---|
| 2015/0279845 A1 | 10/2015 | Kishida | |
| 2016/0181442 A1 | 6/2016 | Higashida | |
| 2019/0140094 A1 | 5/2019 | Kurokawa et al. | |
| 2019/0181261 A1 * | 6/2019 | Okumura | H10D 62/105 |
| 2020/0303540 A1 | 9/2020 | Miyashita | |

FOREIGN PATENT DOCUMENTS

| | | | |
|---|---|---|---|
| JP | 2014-170780 A | 9/2014 | |
| JP | 2020-191401 A | 11/2020 | |
| JP | 2021-068741 A | 4/2021 | |
| WO | WO-2016042621 A1 * | 3/2016 | H10D 30/60 |

* cited by examiner

FIELD-EFFECT TRANSISTOR AND METHOD FOR MANUFACTURING SAME

CROSS REFERENCE TO RELATED APPLICATION

The present application is a continuation application of International Patent Application No. PCT/JP2022/001571 filed on Jan. 18, 2022, which designated the U.S. and claims the benefit of priority from Japanese Patent Application No. 2021-098031 filed on Jun. 11, 2021. The entire disclosures of all of the above applications are incorporated herein by reference.

TECHNICAL FIELD

The present disclosure relates to a field-effect transistor and a method for manufacturing the field-effect transistor.

BACKGROUND

A field-effect transistor has p-type deep layers protruding downward from a body region. Each of the deep layers extends along a direction intersecting each trench.

SUMMARY

Afield-effect transistor includes: a semiconductor substrate having trenches on an upper surface; a gate insulating film covering an inner surface of the trench; and a gate electrode disposed in the trench and insulated from the semiconductor substrate by the gate insulating film. The semiconductor substrate includes n-type source regions, a p-type body region, an n-type drift region, and p-type breakdown voltage regions. The semiconductor substrate has an inter-trench range located between the trenches. Each of the source regions is provided in the corresponding inter-trench range and is in contact with the corresponding gate insulating film. The body region extends over the inter-trench range, and is in contact with the gate insulating film on a lower side of the source region within the inter-trench range. The drift region is distributed over a range from the inter-trench range to a lower side of each trench, and is in contact with the gate insulating film on a lower side of the body region. The breakdown voltage regions are provided within the inter-trench range. The breakdown voltage regions are arranged to form rows extending in a first direction intersecting the trenches. In each of the rows, the breakdown voltage regions are arranged at interval in the first direction. The rows are arranged at interval in a second direction parallel to the trenches. Each of the breakdown voltage regions has a p-type impurity concentration higher than that of the body region, extends from an upper side of a lower end of each of the trenches to a lower side of the lower end of each of the trenches, and is distanced from the gate insulating film. The drift region is in contact with the gate insulating film at a position between the breakdown voltage region and the gate insulating film.

DETAILED DESCRIPTION

Figure 1:
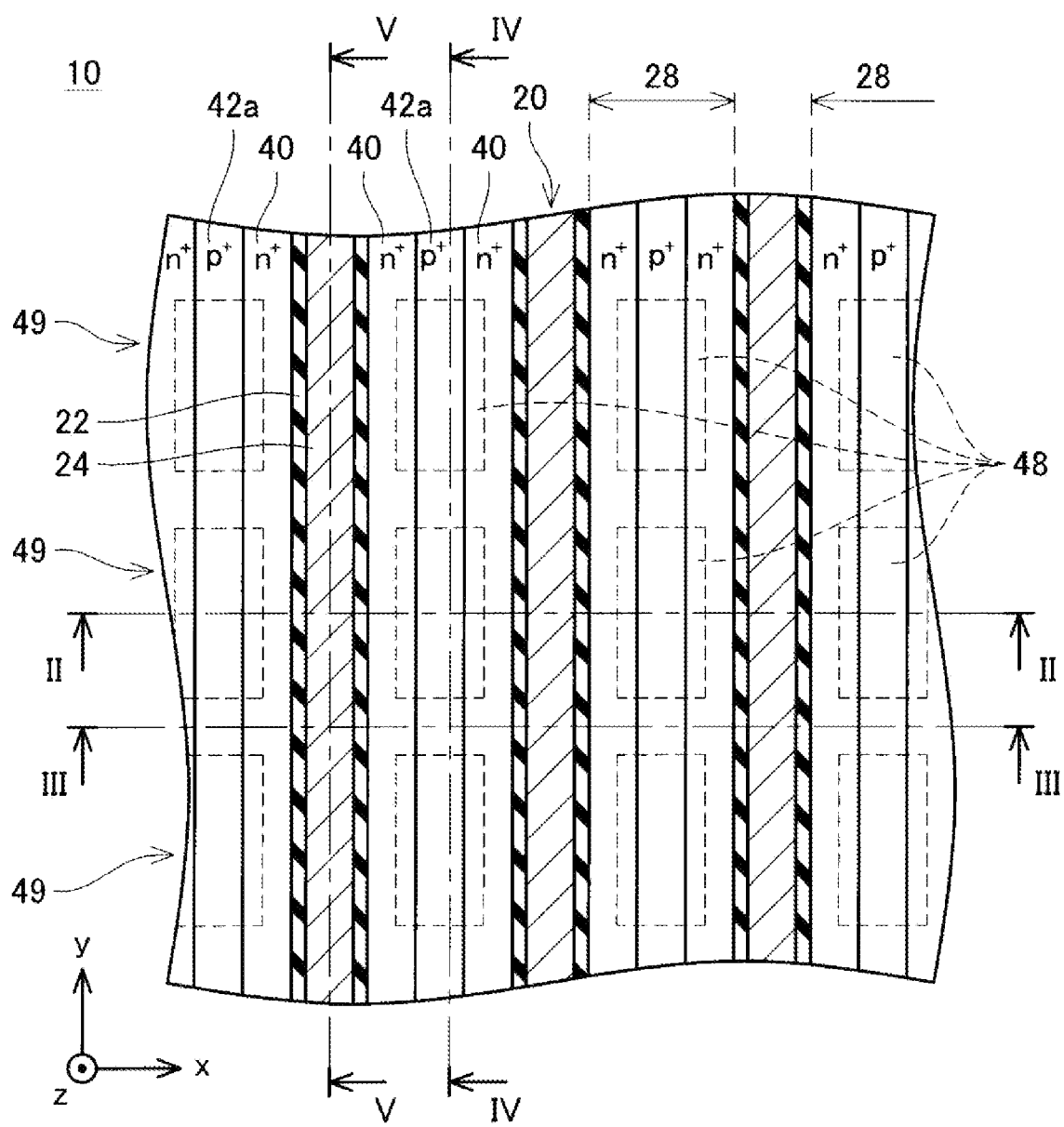
FIG. 1 is a plan view illustrating a MOSFET according to an embodiment as viewed from an upper side (in which a source electrode and an interlayer insulating film are omitted).

Afield-effect transistor has p-type deep layers protruding downward from a body region. Each of the deep layers extends along a direction intersecting each trench. The deep layers are arranged at intervals in a direction parallel to the trenches. Each of the deep layers extends from an upper side of the lower end of each trench to a lower side of the lower end of each trench. According to this configuration, since a depletion layer extends from each deep layer to the drift region, electric field concentration at the lower end of each trench is suppressed. Accordingly, the gate insulating film can be protected from an electric field at the lower end of each trench.

In the field-effect transistor, each deep layer is in contact with the side surface of the trench (that is, the gate insulating film) on the lower side of the body region. Therefore, electrons that have passed through the channel formed in the body region cannot flow from the body region into the deep layer below the body region. That is, the electrons bypass the deep layer and flow to the drift region. Therefore, the field-effect transistor has an issue of a high on-voltage. The present specification proposes a field-effect transistor capable of suppressing electric field concentration at a lower end of a trench and reducing an on-voltage.

Afield-effect transistor includes: a semiconductor substrate having trenches on an upper surface; a gate insulating film covering an inner surface of the trench; and a gate electrode disposed in the trench and insulated from the semiconductor substrate by the gate insulating film. The semiconductor substrate includes n-type source regions, a p-type body region, an n-type drift region, and p-type breakdown voltage regions. The semiconductor substrate has an inter-trench range located between the plurality of trenches. Each of the source regions is provided in the corresponding inter-trench range and is in contact with the corresponding gate insulating film. The body region extends over the inter-trench range, and is in contact with the gate insulating films on a lower side of the source region within the inter-trench range. The drift region is distributed over a range from the inter-trench range to a lower side of each trench, and is in contact with the gate insulating film on a lower side of the body region. The breakdown voltage regions are provided within the inter-trench range. The breakdown voltage regions are arranged to form rows extending along a first direction intersecting the trenches. In each of the rows, the breakdown voltage regions are arranged at interval in the first direction. The rows are arranged at interval in a second direction parallel to the trenches. Each of the breakdown voltage regions has a p-type impurity concentration higher than that of the body region, extends from an upper side of a lower end of each of the trenches to a lower side of the lower end of each of the trenches, and is distanced from the gate insulating film. The drift region is in contact with the gate insulating film at a position between the breakdown voltage region and the gate insulating film.

In this field-effect transistor, the p-type breakdown voltage region extends from the upper side of the lower end of each trench to the lower side of the lower end of each trench at a position spaced from the gate insulating film. When the field-effect transistor is turned off, a depletion layer extends from each breakdown voltage region into the drift region. The breakdown voltage regions are arranged at positions spaced from the gate insulating film. However, since the p-type impurity concentration of each breakdown voltage region is high, the depletion layer can extend from each breakdown voltage region to the periphery of the lower end of the trench. Therefore, electric field concentration at the lower end of each trench is suppressed, and the gate insulating film is protected from the electric field. In the field-effect transistor, the drift region is in contact with the gate insulating film at a position between the breakdown voltage region and the gate insulating film. Therefore, when the field-effect transistor is turned on, electrons that have passed through the channel formed in the body region can flow to the drift region without being blocked by the breakdown voltage region. Therefore, the field-effect transistor has a low on-resistance.

The field-effect transistor may further include p-type bottom regions. Each of the bottom regions may have a p-type impurity concentration lower than that of each of the breakdown voltage regions. Each of the bottom regions may be in contact with the gate insulating film at the lower end of the corresponding trench, and may be spaced from the breakdown voltage region.

Accordingly, the electric field concentration at the lower end of the trench can be more effectively suppressed by the bottom region.

In the field-effect transistor, the drift region may include a low-concentration region and a high-concentration region having an n-type impurity concentration higher than that of the low-concentration region. The high-concentration region may be distributed from a position in contact with the body region to a lower side of the lower end of each of the trenches, and may be in contact with the gate insulating film at a position between the breakdown voltage region and the gate insulating film. The low-concentration region may be in contact with the high-concentration region from the lower side.

The present specification proposes a method of manufacturing the field-effect transistor. The manufacturing method may include: forming a mask extending in a lattice shape on an upper surface of the semiconductor substrate; and forming the breakdown voltage regions in the semiconductor substrate by implanting a p-type impurity into the semiconductor substrate through the mask.

Accordingly, since the mask is formed in a lattice shape, the mask can be stably formed. That is, it is possible to suppress partial collapse of the mask. Therefore, the field-effect transistor can be suitably manufactured.

The manufacturing method may further include: forming the trenches on the upper surface of the semiconductor substrate; and forming the body region and the bottom region by implanting a p-type impurity into the upper surface of the semiconductor substrate and a lower surface of the trench.

Accordingly, the body region and the bottom region can be formed at the same time.

FIGS. 1 to 5 show a metal-oxide-semiconductor field-effect transistors (MOSFET) 10 according to an embodiment. The MOSFET 10 has a semiconductor substrate 12. Hereinafter, a thickness direction of the semiconductor substrate 12 is referred to as a z direction, a direction orthogonal to the z direction is referred to as an x direction, and a direction orthogonal to the z direction and the x direction is referred to as a y direction. The x direction and the y direction are parallel to the upper surface 12*a* and the lower surface 12*b* of the semiconductor substrate 12.

Figure 2:
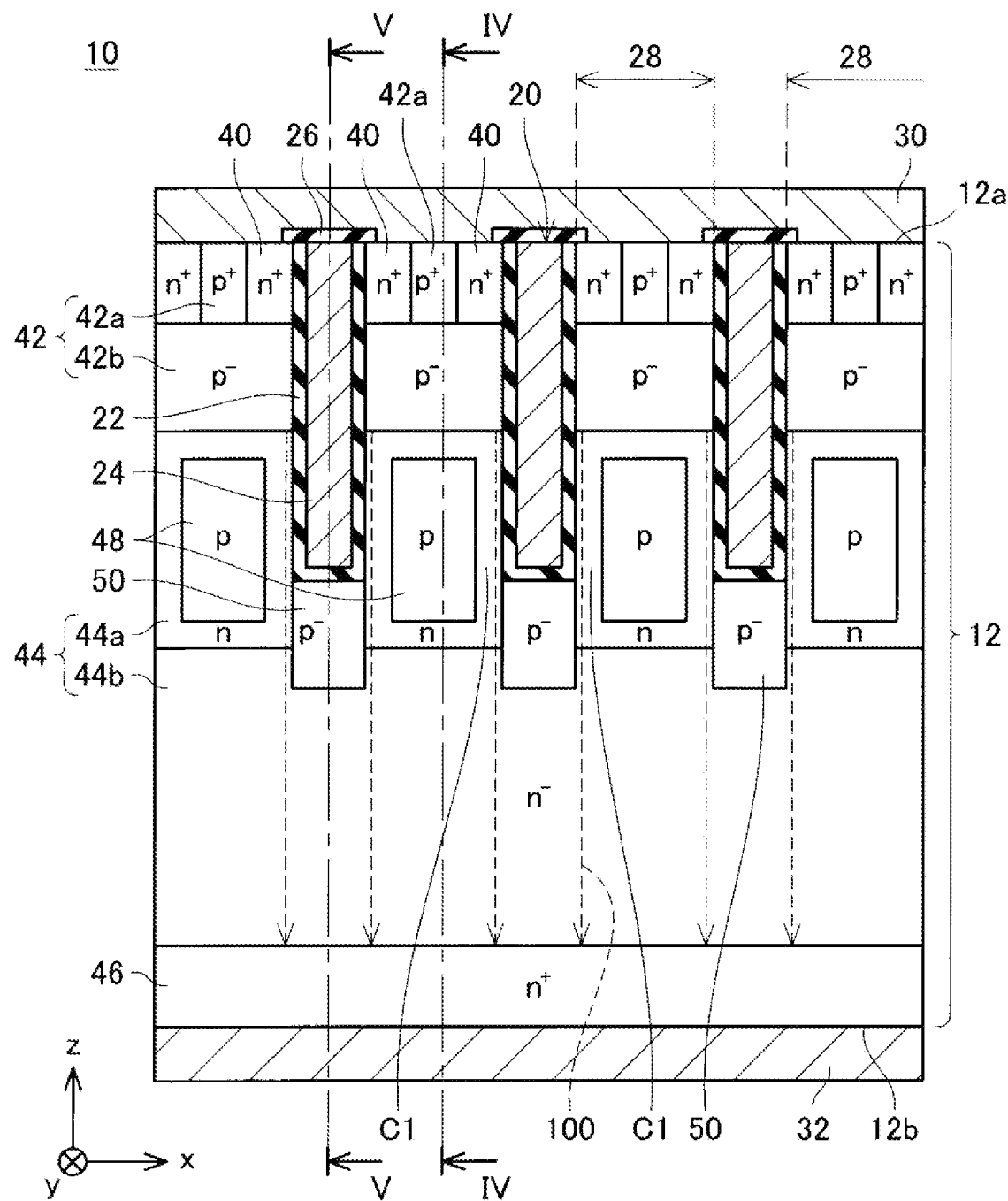
FIG. 2 is a cross-sectional view taken along line II-II of FIGS. 1, 4 and 5.
Figure 3:
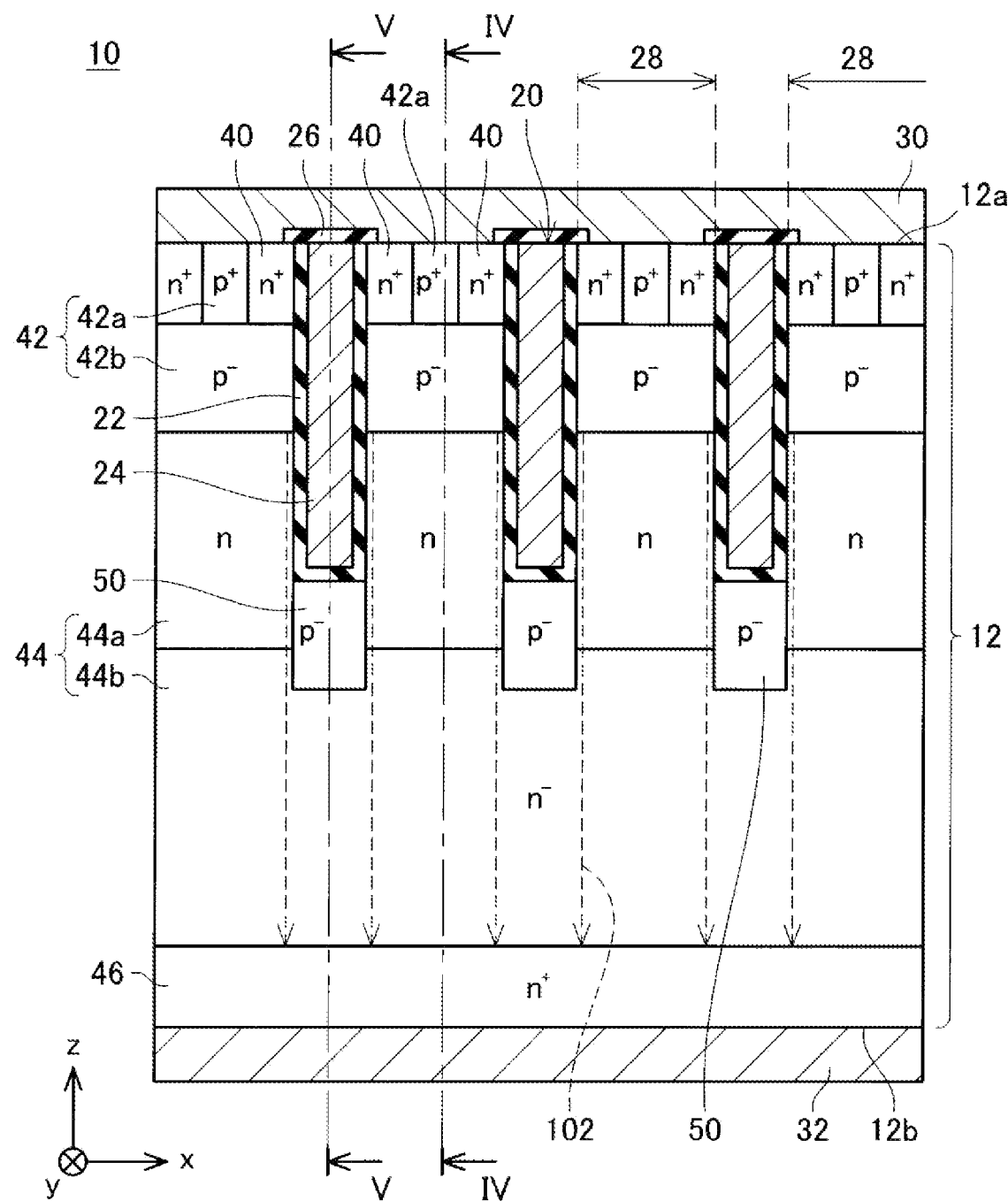
FIG. 3 is a cross-sectional view taken along line III-Ill of FIGS. 1, 4 and 5.
Figure 4:
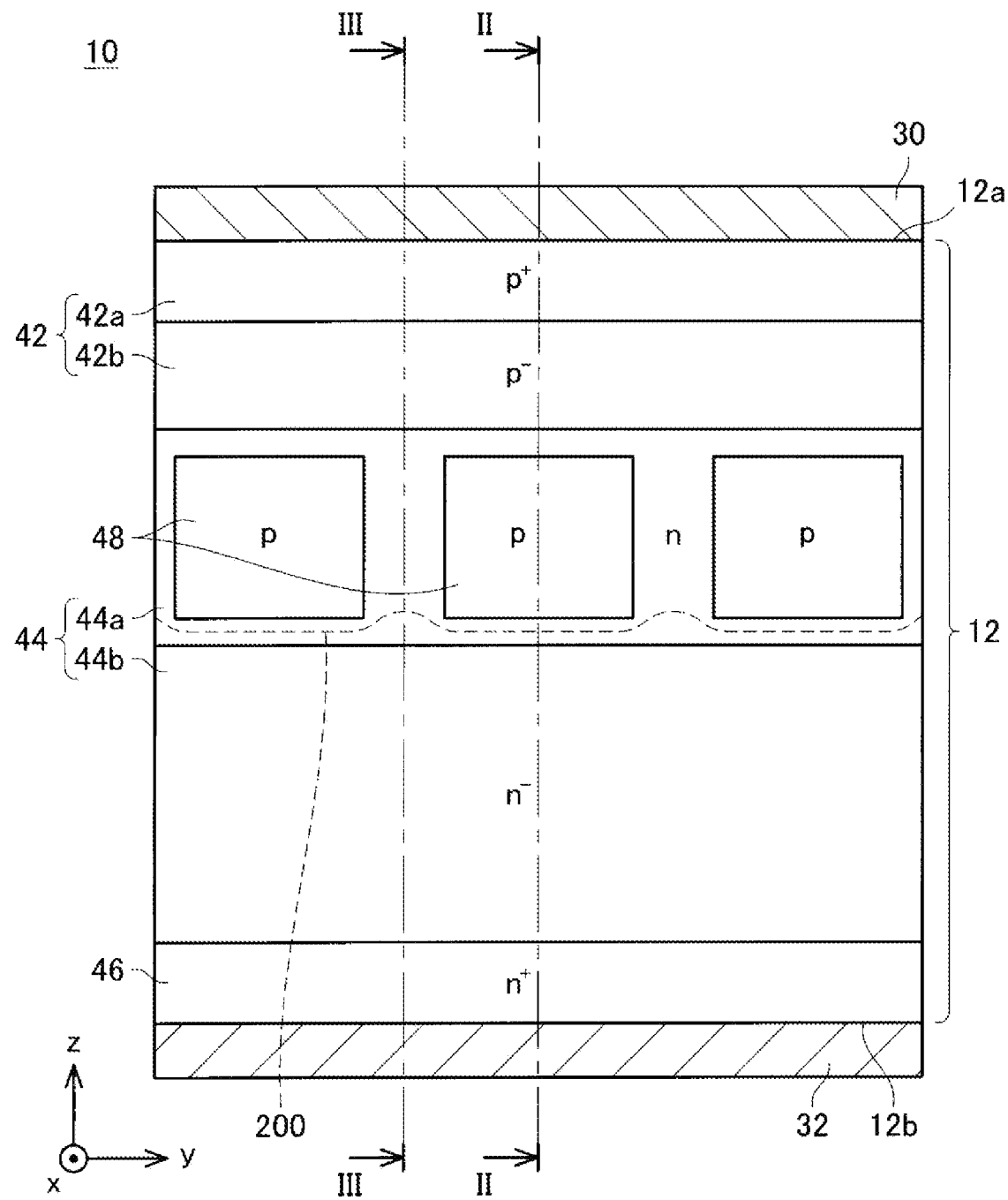
FIG. 4 is a cross-sectional view taken along line IV-IV of FIGS. 1 to 3.

As shown in FIGS. 1 to 3, trenches 20 are provided on the upper surface 12*a* of the semiconductor substrate 12. As shown in FIG. 1, each trench 20 extends linearly in the y direction. The trenches 20 are arranged to be spaced away from each other at intervals in the x direction. Hereinafter, an internal range of the semiconductor substrate 12 interposed between the trenches 20 is referred to as an inter-trench range 28.

The inner surface of each trench 20 is covered with a gate insulating film 22. A gate electrode 24 is arranged in each of the trenches 20. The gate electrode 24 is insulated from the semiconductor substrate 12 through the gate insulating film 22. The upper surface of each gate electrode 24 is covered with an interlayer insulating film 26.

As shown in FIGS. 2 to 5, the source electrode 30 is disposed on the upper surface 12*a* of the semiconductor substrate 12. The source electrode 30 covers the interlayer insulating film 26 and the upper surface 12*a* of the semiconductor substrate 12. The source electrode 30 is in contact with the upper surface 12*a* of the semiconductor substrate 12 in a range where the interlayer insulating film 26 does not exist. The source electrode 30 is insulated from the gate electrode 24 by the interlayer insulating films 26.

The drain electrode 32 is disposed on the lower surface 12*b* of the semiconductor substrate 12. The drain electrode 32 is in contact with substantially the entire lower surface 12*b* of the semiconductor substrate 12.

As illustrated in FIGS. 1 to 5, the semiconductor substrate 12 includes source regions 40, a body region 42, a drift region 44, a drain region 46, breakdown voltage regions 48, and bottom regions 50.

As shown in FIGS. 1 to 3, each source region 40 is an n-type region and has a relatively high n-type impurity concentration. Each source region 40 is disposed within the corresponding inter-trench range 28. Two source regions 40 are provided in each inter-trench range 28. Each source region 40 is disposed at a position adjacent to the corresponding trench 20. As shown in FIG. 1, each source region 40 extends in the y direction along the trench 20. As shown in FIGS. 2 and 3, each source region 40 is in contact with the gate insulating film 22 at the upper end portion of the corresponding trench 20. The source region 40 is in ohmic contact with the source electrode 30.

The body region 42 is a p-type region. As shown in FIGS. 2 and 3, the body region 42 extends over the inter-trench range 28. The body region 42 includes contact regions 42a and low concentration regions 42b. Each contact region 42a has a higher p-type impurity concentration than the low concentration region 42b. Each contact region 42a is disposed between the two source regions 40 within the corresponding inter-trench range 28. Each of the contact regions 42a is in ohmic contact with the source electrode 30. As shown in FIG. 1, each contact region 42a extends in the y direction along the trench 20. As shown in FIGS. 2 and 3, the low concentration region 42b is distributed over the inter-trench range 28. The low concentration region 42b is in contact with the contact region 42a and the source region 40 from the lower side in each inter-trench range 28. The low concentration region 42b is in contact with the gate insulating film 22 below each source region 40.

The drift region 44 is an n-type region having an n-type impurity concentration lower than that of the source region 40. As shown in FIGS. 2 and 3, the drift region 44 is in contact with the body region 42 (more specifically, the low concentration region 42b) from the lower side. The drift region 44 is in contact with the gate insulating film 22 below the body region 42. The drift region 44 is separated from the source region 40 by the body region 42. The drift region 44 is distributed inside of each inter-trench range 28 and also in a range below each trench 20. In the range below each trench 20, the drift region 44 is widely distributed in the lateral direction. The drift region 44 includes a high concentration region 44a and a low concentration region 44b. The high concentration region 44a has an n-type impurity concentration higher than that of the low concentration region 44b. The high concentration region 44a is in contact with the body region 42 (more specifically, the low concentration region 42b) from the lower side. The high concentration region 44a is distributed from a position in contact with the body region 42 to a lower side of a lower end of each trench 20. The low concentration region 44b is disposed below the lower end of each trench 20. The low concentration region 44b is in contact with the high concentration region 44a from the lower side. The low concentration region 44b is widely distributed in the lateral direction across the range below each inter-trench range 28.

The drain region 46 is an n-type region with a higher n-type impurity concentration than the drift region 44. The drain region 46 is in contact with the drift region 44 (more specifically, the low concentration region 44b) from the lower side. The drain region 46 is arranged in a range including the lower surface 12b of the semiconductor substrate 12. The drain region 46 is in ohmic contact with the drain electrode 32.

The breakdown voltage regions 48 are p-type regions having a higher p-type impurity concentration than the body region 42. As shown in FIG. 2, each breakdown voltage region 48 is disposed within the corresponding inter-trench range 28. Each breakdown voltage region 48 is arranged in a range surrounded by the drift region 44 (more specifically, the high concentration region 44a). As shown in FIG. 1, plural breakdown voltage regions 48 are provided in each inter-trench range 28. Within each inter-trench range 28, the breakdown voltage regions 48 are arranged at intervals in the y direction (that is, a direction parallel to the trench 20). The plural breakdown voltage regions 48 arranged in different inter-trench ranges 28 are linearly arranged along the x direction (the direction intersecting the trenches 20) to form a row 49. In each row 49, the breakdown voltage regions 48 are arranged at intervals in the x direction. Plural rows 49 (extending in the x direction) of the breakdown voltage regions 48 are formed in the semiconductor substrate 12. The rows 49 are arranged at intervals in the y direction. As shown in FIG. 2, each breakdown voltage region 48 extends from a position above the lower end of each trench 20 to a position below the lower end of each trench 20. An interval C1 is provided between the breakdown voltage region 48 and the gate insulating film 22. Therefore, each breakdown voltage region 48 is not in contact with the gate insulating film 22. The drift region 44 (more specifically, the high concentration region 44a) is arranged at the interval C1. In the interval C1, the drift region 44 (more specifically, the high concentration region 44a) is in contact with the gate insulating film 22. Each of the breakdown voltage regions 48 is separated from the body region 42. Each breakdown voltage region 48 floats in the drift region 44. As shown in FIG. 3, at the position where the breakdown voltage region 48 is not provided, the drift region 44 (more specifically, the high concentration region 44a) is in contact with the gate insulating film 22 on the lower side of the body region 42.

Figure 5:
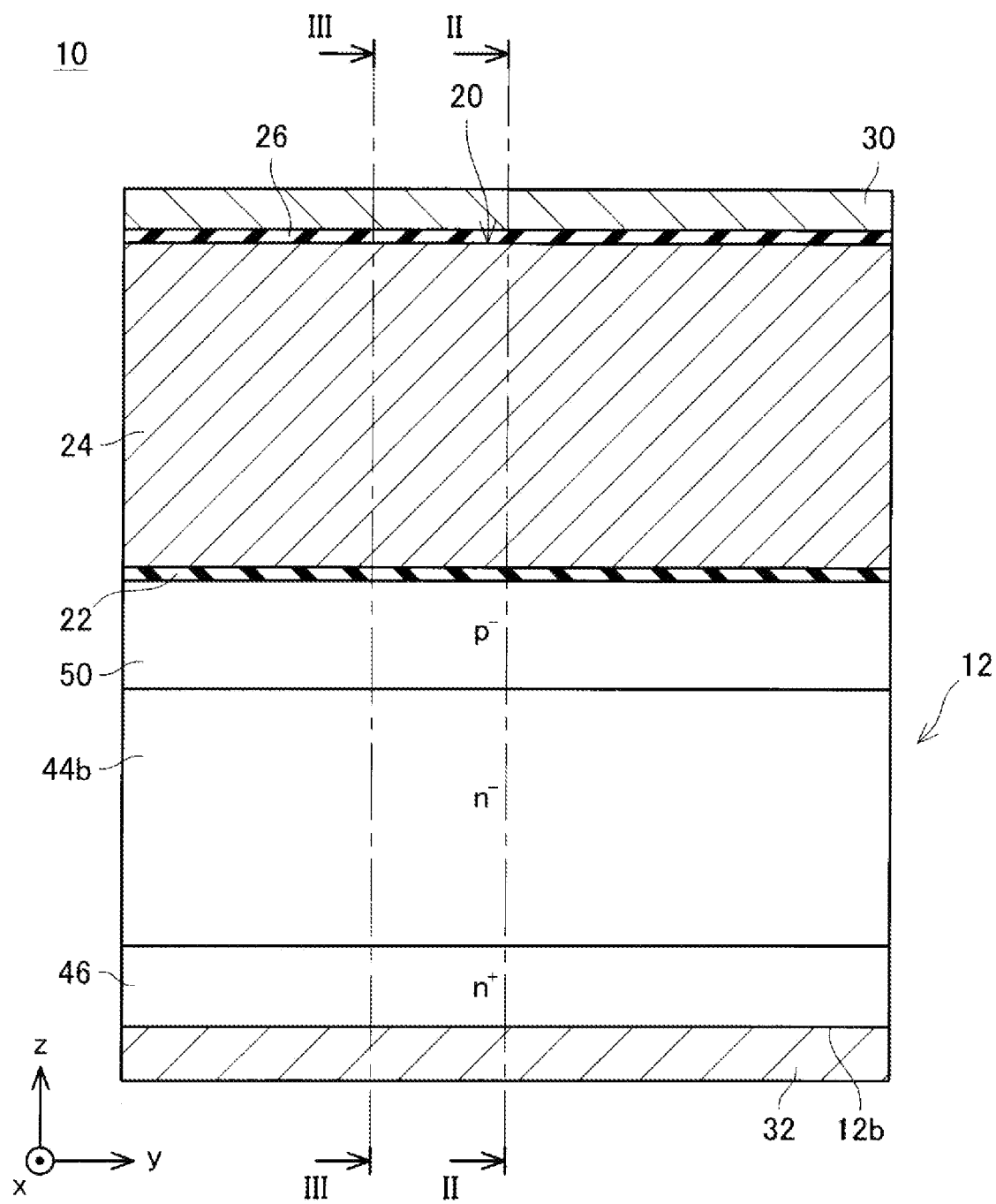
FIG. 5 is a cross-sectional view taken along V-V of FIGS. 1 to 3.

The bottom regions 50 are p-type regions having a p-type impurity concentration lower than that of the breakdown voltage region 48. The p-type impurity concentration of each bottom region 50 is substantially equal to the p-type impurity concentration of the body region 42. As shown in FIGS. 2 and 3, each bottom region is disposed below the corresponding trench 20. Each bottom region 50 is in contact with the gate insulating film 22 at the bottom surface of the corresponding trench 20. The drift region 44 is in contact with the side surface and the bottom surface of each bottom region 50. Each bottom region 50 floats in the drift region 44. Each bottom region 50 extends from the lower end of each trench 20 to have a depth reaching the low concentration region 44b. As shown in FIG. 5, each bottom region 50 continuously extends in the y direction along the trench 20. Each bottom region 50 is in contact with the gate insulating film 22 over substantially the entire bottom surface of the corresponding trench 20. As shown in FIG. 2, an interval is provided between the bottom region 50 and the breakdown voltage region 48. Therefore, each bottom region is not in contact with the breakdown voltage region 48.

Next, the operation of the MOSFET 10 will be described. When a potential equal to or higher than a threshold value is applied to the gate electrode 24, a channel is formed in the body region 42 in the vicinity of the gate insulating film 22. When a potential higher than that of the source electrode 30 is applied to the drain electrode 32 in a state where the channel is formed, electrons flow from the source region 40 to the drain region 46 via the channel and the drift region 44. That is, the MOSFET 10 is turned on. In the cross-section shown in FIG. 3 in which the breakdown voltage region 48 does not exist, the electrons having passed through the channel flow downward in the drift region 44 as indicated by an arrow 102. In addition, in the cross-section illustrated in FIG. 2 in which the breakdown voltage region 48 is present, since the breakdown voltage region 48 is not in contact with the gate insulating film 22 in the lower part of the body region 42, the electrons having passed through the channel flow downward through the drift region 44 in the interval C1 as illustrated by an arrow 100. As described above, in the MOSFET 10 of the embodiment, since the p-type breakdown voltage region 48 is not in contact with the gate insulating film 22, the electrons having passed through the channel can flow downward along the side surface of the trench 20. Therefore, the on-resistance of the MOSFET 10 is low.

In a state where the MOSFET 10 is turned on, a depletion layer having a minute width extends from the breakdown voltage region 48 and the bottom region 50 (that is, the p-type region) into the drift region 44. As described above, since the breakdown voltage region 48 is disposed at a position away from the gate insulating film 22, the depletion layer extending from the breakdown voltage region 48 into the drift region 44 does not reach the gate insulating film 22. Therefore, the flow of electrons is restricted from being hindered by the depletion layer extending from the breakdown voltage region 48 into the drift region 44. In addition, since the p-type impurity concentration of the bottom region 50 is low, the width of the depletion layer extending from the bottom region 50 into the drift region 44 is extremely small. Therefore, the flow of electrons is restricted from being hindered by the depletion layer extending from the bottom region 50 into the drift region 44. As described above, since the depletion layer extending from the breakdown voltage region 48 and the bottom region 50 hardly obstructs the flow of electrons, the on-resistance of the MOSFET 10 is further reduced.

In the MOSFET 10 of the embodiment, the drift region 44 around the withstand voltage region 48 is configured by the high concentration region 44a. Since the n-type impurity concentration of the high concentration region 44a is high, the resistivity of the high concentration region 44a is low. Therefore, the electrons having passed through the channel can flow in the high concentration region 44a with low loss. Since the drift region 44 in the narrow interval C1 is constituted by the high concentration region 44a, electrons can pass through the interval C1 with low loss. This further reduces the on-resistance of the MOSFET 10.

When the potential of the gate electrode 24 is lowered to a value less than the threshold, the channel disappears and the flow of electrons stops. In other words, the MOSFET 10 is turned off. When the MOSFET 10 is turned off, the depletion layer spreads from the body region 42 to the drift region 44, and the drift region 44 is depleted in a wide range. At this time, the depletion layer also extends widely from the breakdown voltage region 48 and the bottom region 50 to the drift region 44. The breakdown voltage region 48 is disposed at a position away from the lower end of the trench 20. However, since the p-type impurity concentration of the breakdown voltage region 48 is high, the depletion layer extending from the breakdown voltage region 48 extends to the periphery of the lower end of the trench 20. In this manner, the drift region 44 is depleted around the lower end of the trench 20 by the depletion layer extending from the breakdown voltage region 48, so that electric field concentration at the lower end of the trench 20 is suppressed. The drift region 44 is also depleted around the lower end of the trench 20 by the depletion layer extending from the bottom region 50. This also suppresses electric field concentration at the lower end of the trench 20. As described above, the depletion layer spreads from the breakdown voltage region 48 and the bottom region 50 to the periphery of the lower end of the trench 20. Thus, the electric field concentration at the lower end of the trench 20 is suppressed.

Figure 6:
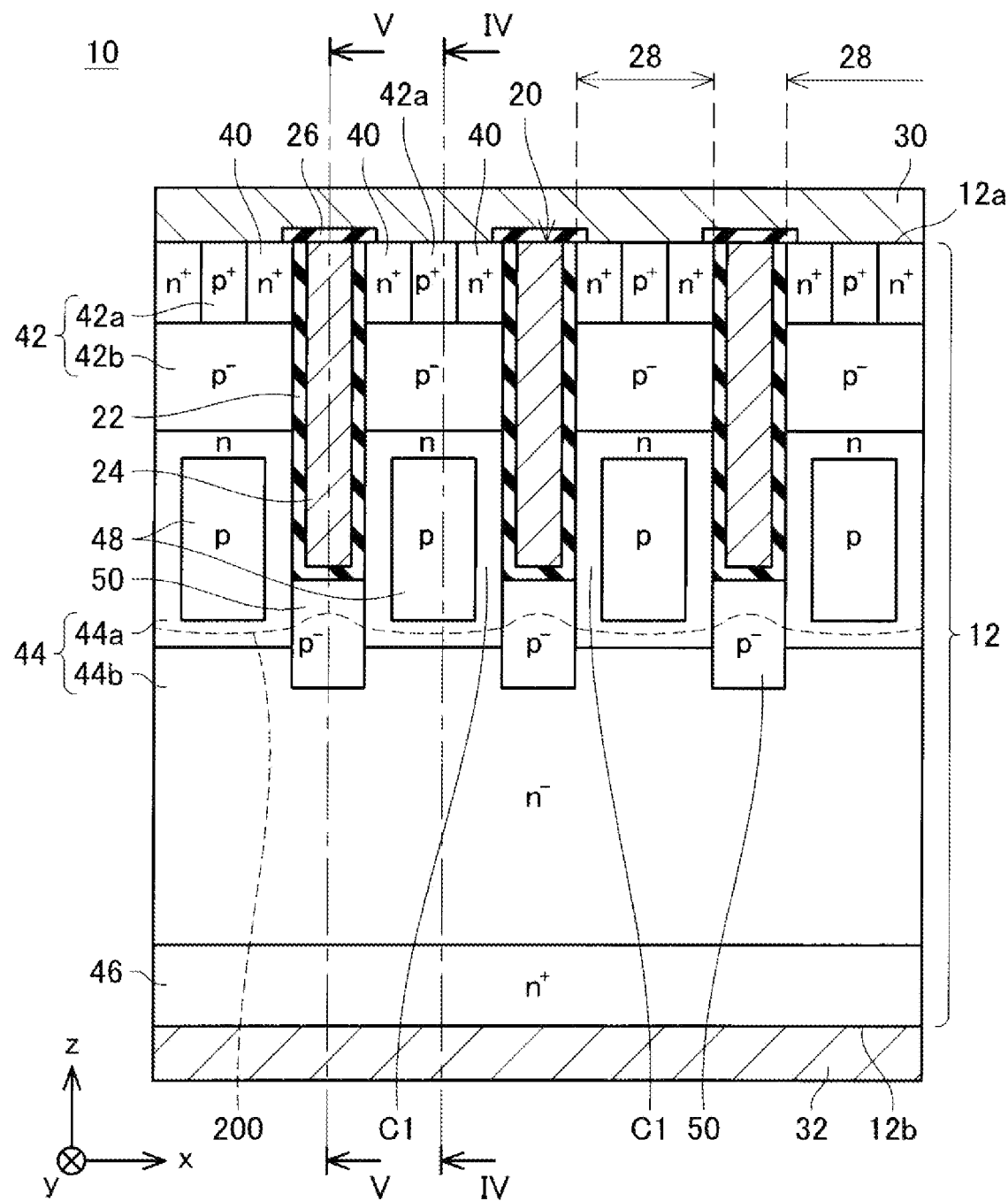
FIG. 6 is a diagram illustrating a distribution of equipotential lines in the cross-section of FIG. 2.

The breakdown voltage region 48 having a high p-type impurity concentration is less likely to be depleted in a state where the MOSFET 10 is turned off. Since the breakdown voltage region 48 which is difficult to be depleted extends from the upper side to the lower side of the lower end of the trench 20, when the MOSFET 10 is turned off, an electric field is difficult to be generated in the drift region 44 in a range above the lower end of the breakdown voltage region 48. That is, as indicated by the broken line 200 in FIGS. 4 and 6, the presence of the breakdown voltage region 48 makes it difficult for the equipotential line to enter the drift region 44 above the lower end of the breakdown voltage region 48. This also suppresses the electric field concentration at the lower end of the trench 20.

As described above, according to the MOSFET 10 of the embodiment, the electric field concentration at the lower end of the trench 20 is suppressed. Therefore, application of a high electric field to the gate insulating film 22 at the lower end of the trench 20 is suppressed. Therefore, the MOSFET 10 has a high breakdown voltage.

In the MOSFET 10 of the embodiment, the breakdown voltage region 48 does not exist around the trench 20. Therefore, the volume of the breakdown voltage region 48 is smaller than that of a conventional MOSFET in which the breakdown voltage region continuously extends in a direction intersecting the trench. However, even in the conventional MOSFET, since the volume occupied by the trench is large at the intersection of the trench and the breakdown voltage region, the volume of the breakdown voltage region at the intersection is relatively small. Therefore, even if the breakdown voltage region 48 is eliminated at the intersection as in the MOSFET 10 of the embodiment, the amount of decrease in the volume of the breakdown voltage region 48 is small. Therefore, in the MOSFET 10 of the embodiment, the volume of the breakdown voltage region 48 can be sufficiently secured, and the depletion layer can be widely extended from the breakdown voltage region 48 into the drift region 44 when the MOSFET 10 is turned off.

As described above, in the MOSFET 10 of the embodiment, the on-resistance can be reduced while maintaining a high breakdown voltage.

Figure 7:
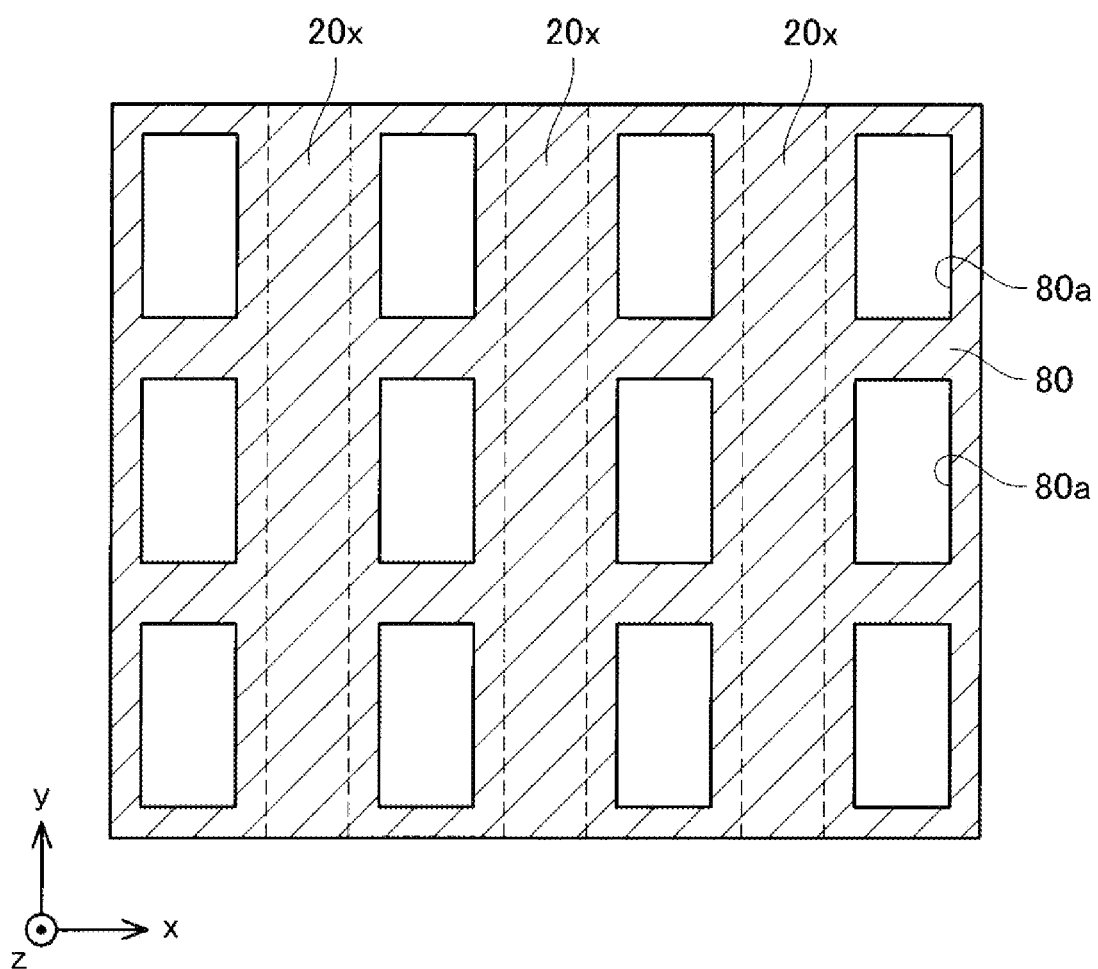
FIG. 7 is an explanatory view illustrating a method of manufacturing the MOSFET (a plan view of the semiconductor substrate as viewed from an upper side).
Figure 8:
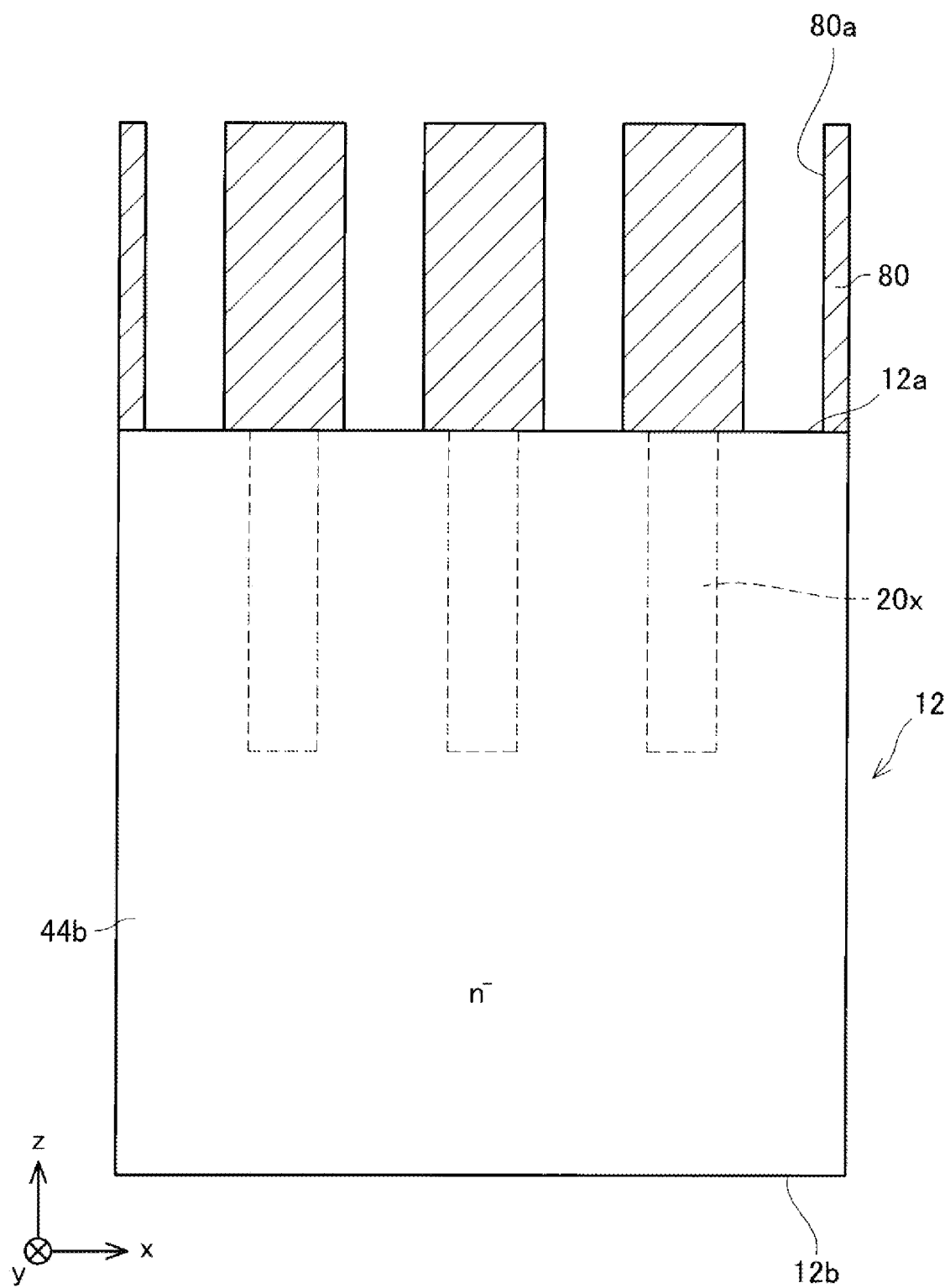
FIG. 8 is an explanatory view illustrating the method of manufacturing the MOSFET (a sectional view corresponding to FIG. 2).

Next, a method of manufacturing the MOSFET 10 will be described. The entire semiconductor substrate 12 before processing is configured by the low concentration region 44b of the drift region 44. First, as shown in FIGS. 7 and 8, a mask 80 is formed on the upper surface 12a of the semiconductor substrate 12. The mask 80 is formed so that the opening 80a is positioned at an upper portion of a range in which the breakdown voltage region 48 is to be formed. In other words, the lattice-like mask 80 is formed to extend so as to avoid the range in which the breakdown voltage region 48 is to be formed. Therefore, the beam portion of the mask 80 extending in the y direction extends along the range 20x in which the trench 20 is to be formed, and the beam portion of the mask 80 extending in the x direction extends in a direction orthogonal to the range 20x in which the trench 20 is to be formed.

Figure 9:
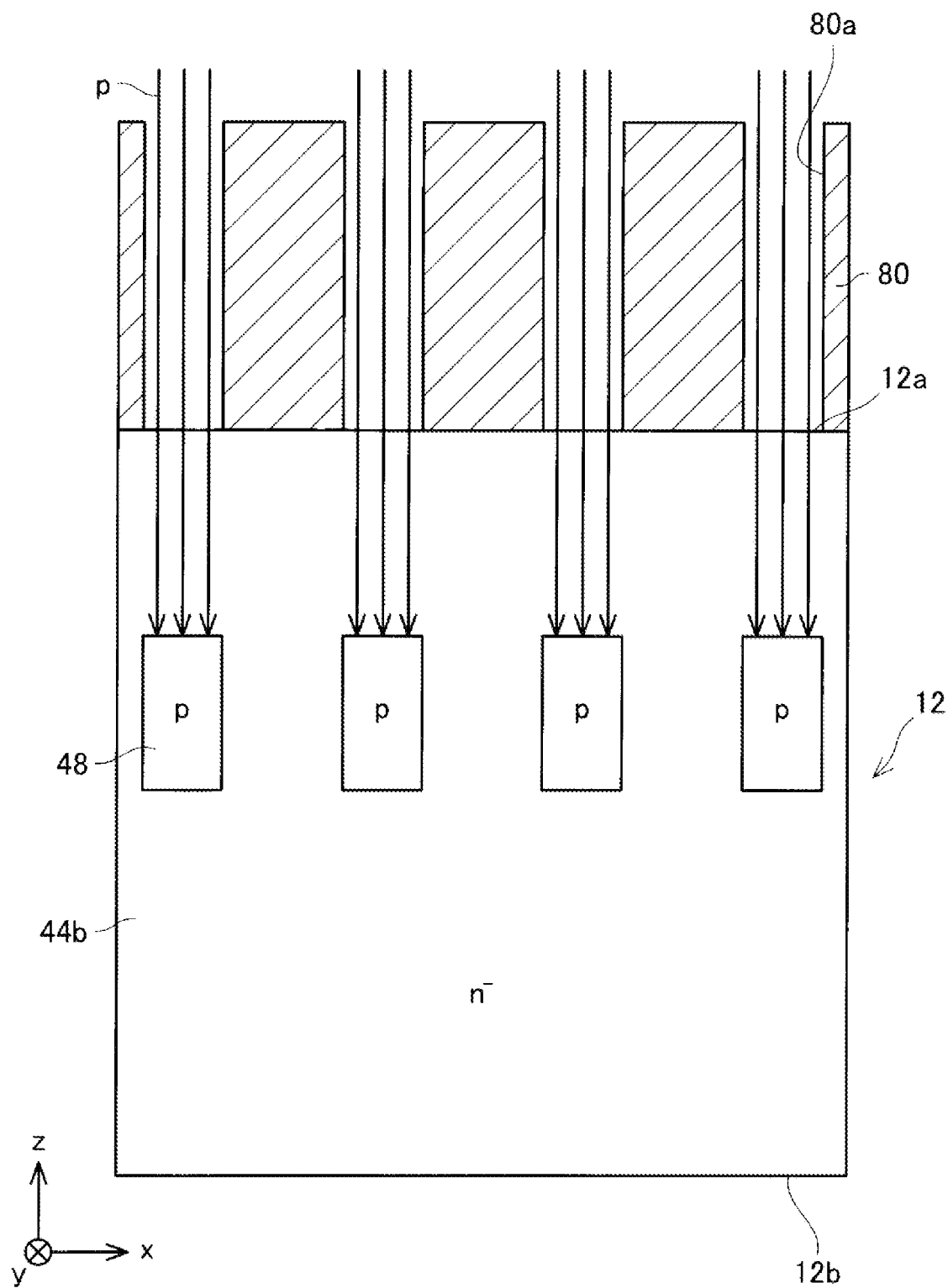
FIG. 9 is an explanatory view illustrating the method of manufacturing the MOSFET (a sectional view corresponding to FIG. 2).

Next, as shown in FIG. 9, p-type impurities are implanted into the semiconductor substrate 12 through the mask 80. The p-type impurity is implanted from the upper surface 12a to a deep position by increasing the implantation energy. Thus, plural breakdown voltage regions 48 are formed. After the formation of the breakdown voltage region 48, the mask 80 is removed.

In the ion implantation process for the breakdown voltage region 48, since high implantation energy is used as described above, it is necessary to increase the thickness of the mask 80. Therefore, the cross-sectional shape of the mask 80 has a high aspect ratio as shown in FIGS. 8 and 9. In general, when a mask is formed with such a high aspect ratio, a part of the mask may collapse. However, in the present embodiment, since the mask 80 is formed in a lattice shape as shown in FIG. 7, the collapse of the mask 80 is restricted.

Figure 10:
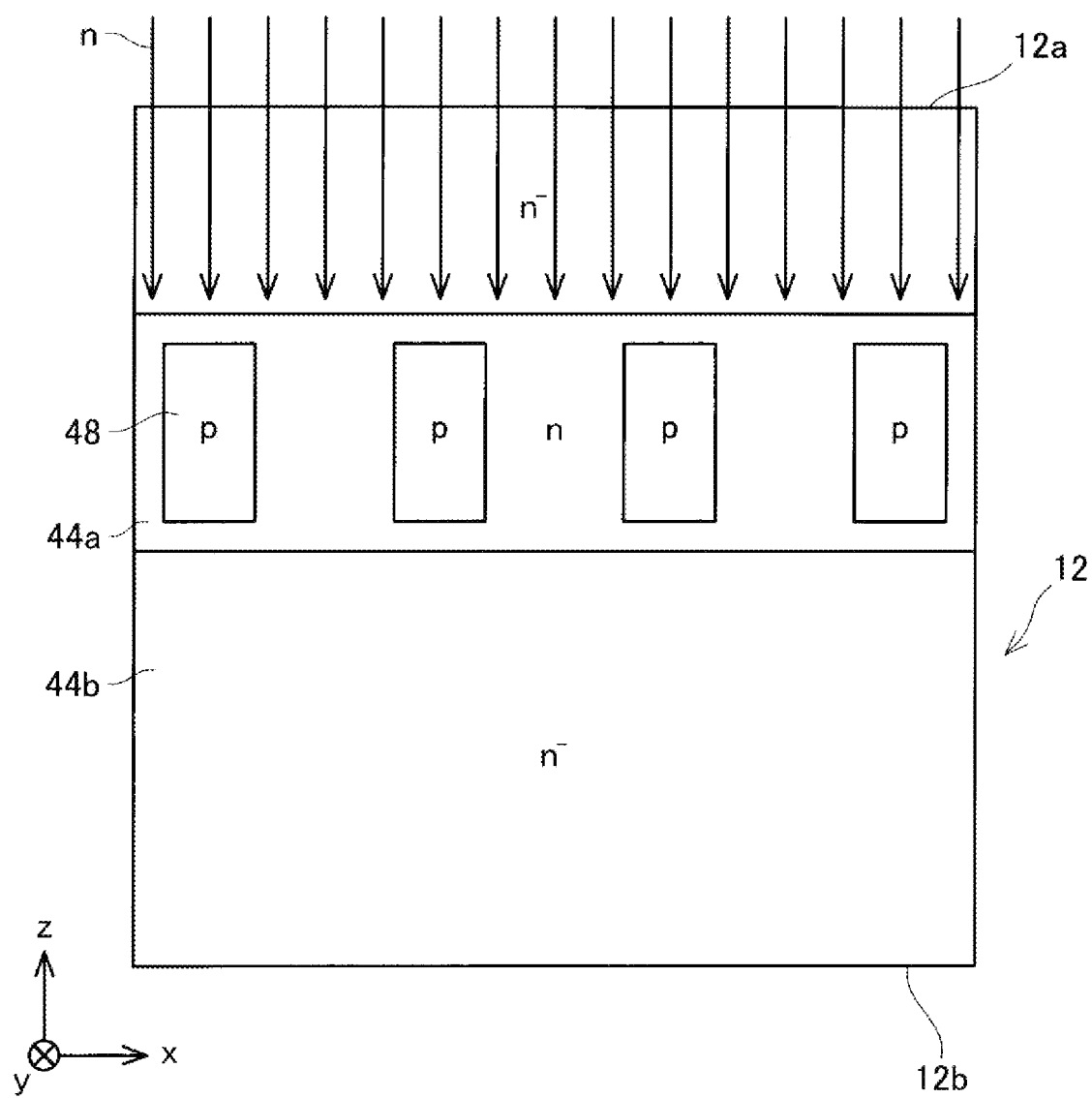
FIG. 10 is an explanatory view illustrating the method of manufacturing the MOSFET (a sectional view corresponding to FIG. 2).

Next, a mask (not shown) covering the outer peripheral portion of the MOSFET 10 is formed, and n-type impurities are ion-implanted into the semiconductor substrate 12 through the mask as shown in FIG. 10. Thereby, the high concentration region 44*a* is formed in the semiconductor substrate 12.

Figure 11:
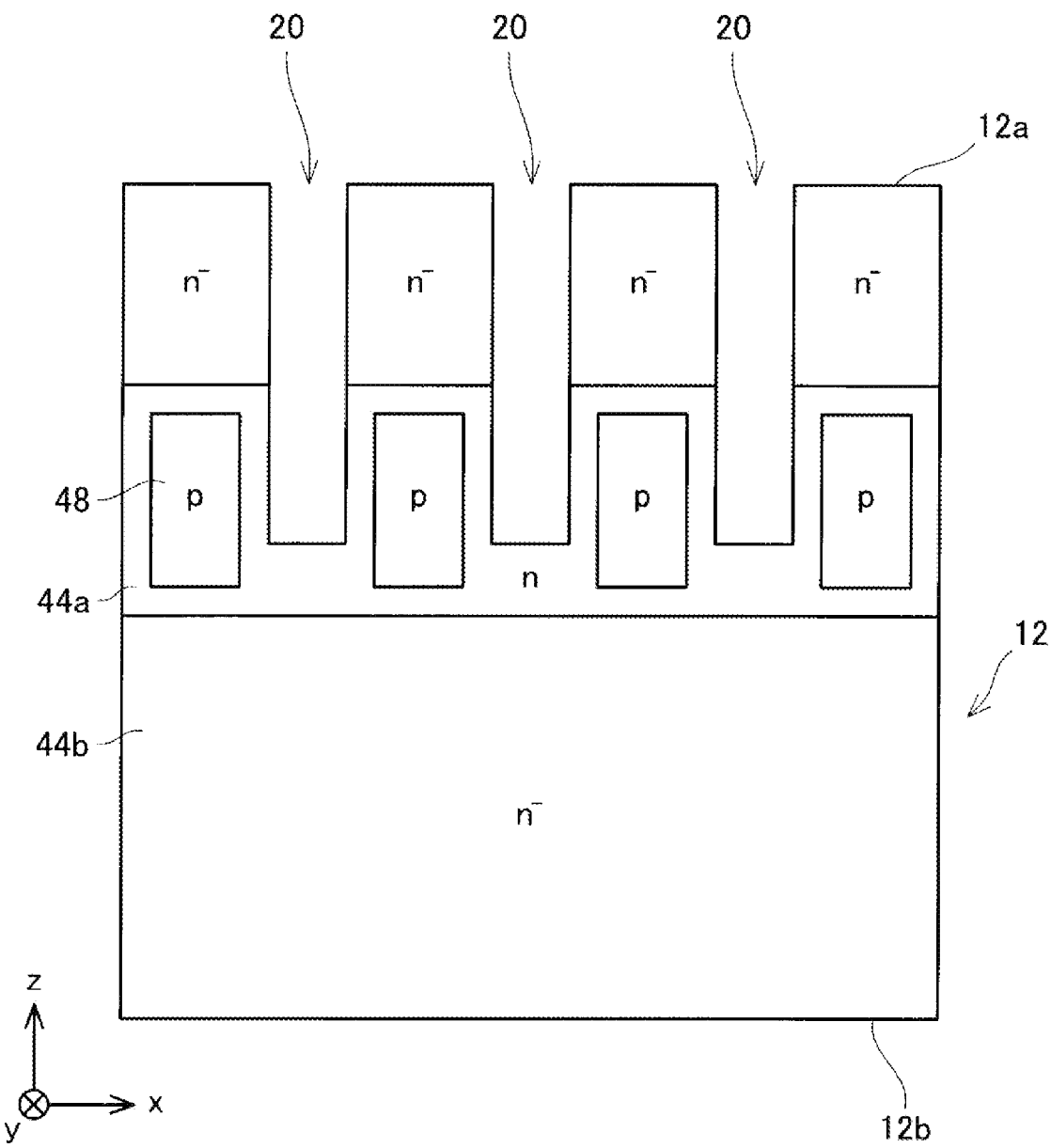
FIG. 11 is an explanatory view illustrating the method of manufacturing the MOSFET (a sectional view corresponding to FIG. 2).

Next, as shown in FIG. 11, the trench 20 is formed by selectively etching the upper surface 12*a* of the semiconductor substrate 12.

Figure 12:
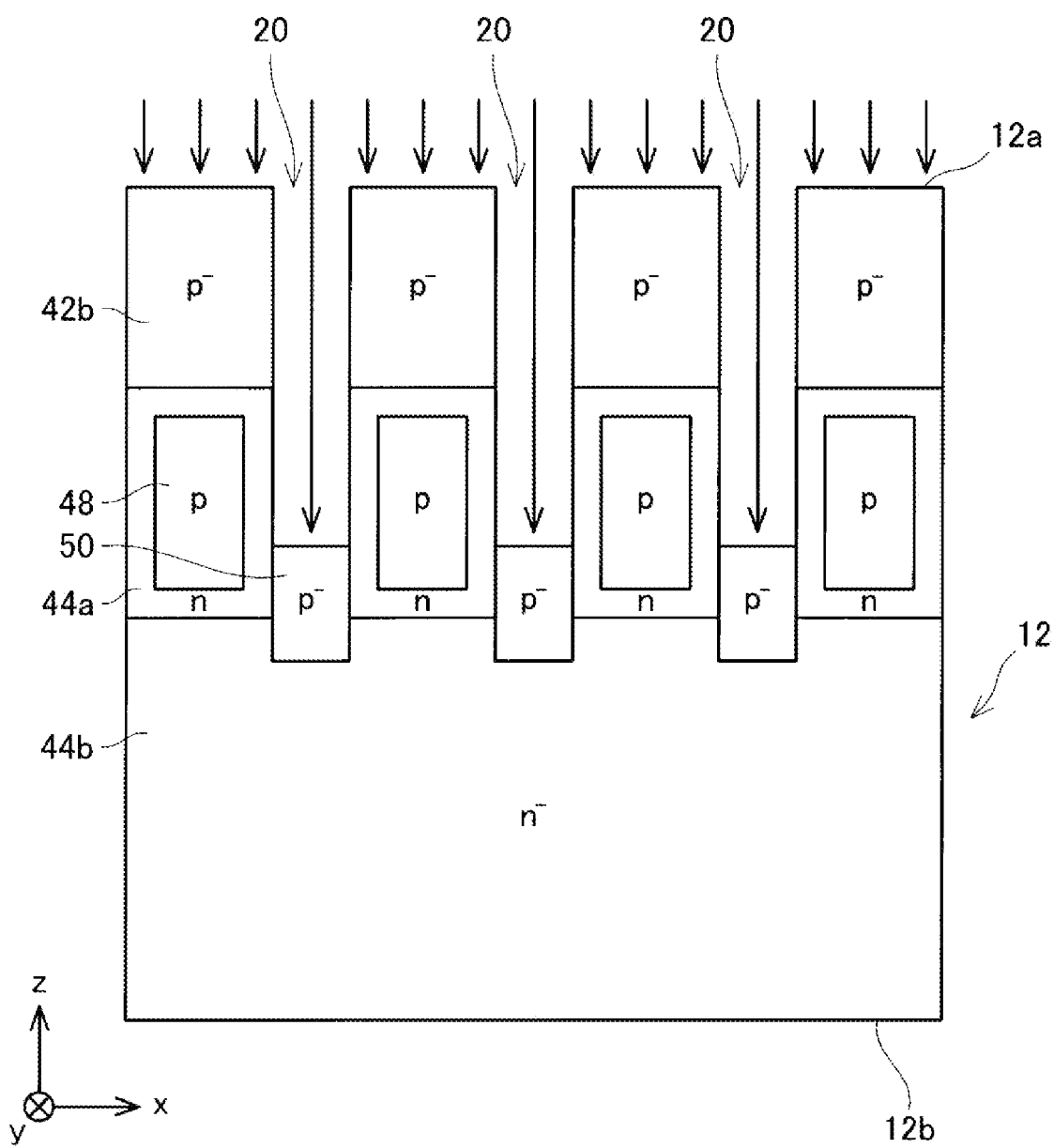
FIG. 12 is an explanatory view illustrating the method of manufacturing the MOSFET (a sectional view corresponding to FIG. 2).

Next, as shown in FIG. 12, p-type impurities are implanted into the semiconductor substrate 12 from the upper surface 12*a*. Thus, the low concentration region 42*b* of the body region 42 is formed. At this time, p-type impurities are also implanted into the bottom surface of the trench 20. As a result, the p-type bottom region 50 is formed in a range of the trench 20 exposed to the bottom surface. As described above, in this manufacturing method, the low concentration region 42*b* and the bottom region 50 can be formed at the same time.

Next, the gate insulating film 22 and the gate electrode 24 are formed in the trench 20. Next, the contact region 42*a*, the source region 40, and the drain region 46 are formed by ion implantation. Thereafter, the interlayer insulating film 26, the source electrode 30, and the drain electrode 32 are formed to complete the MOSFET 10 shown in FIGS. 1 to 5.

Figure 13:
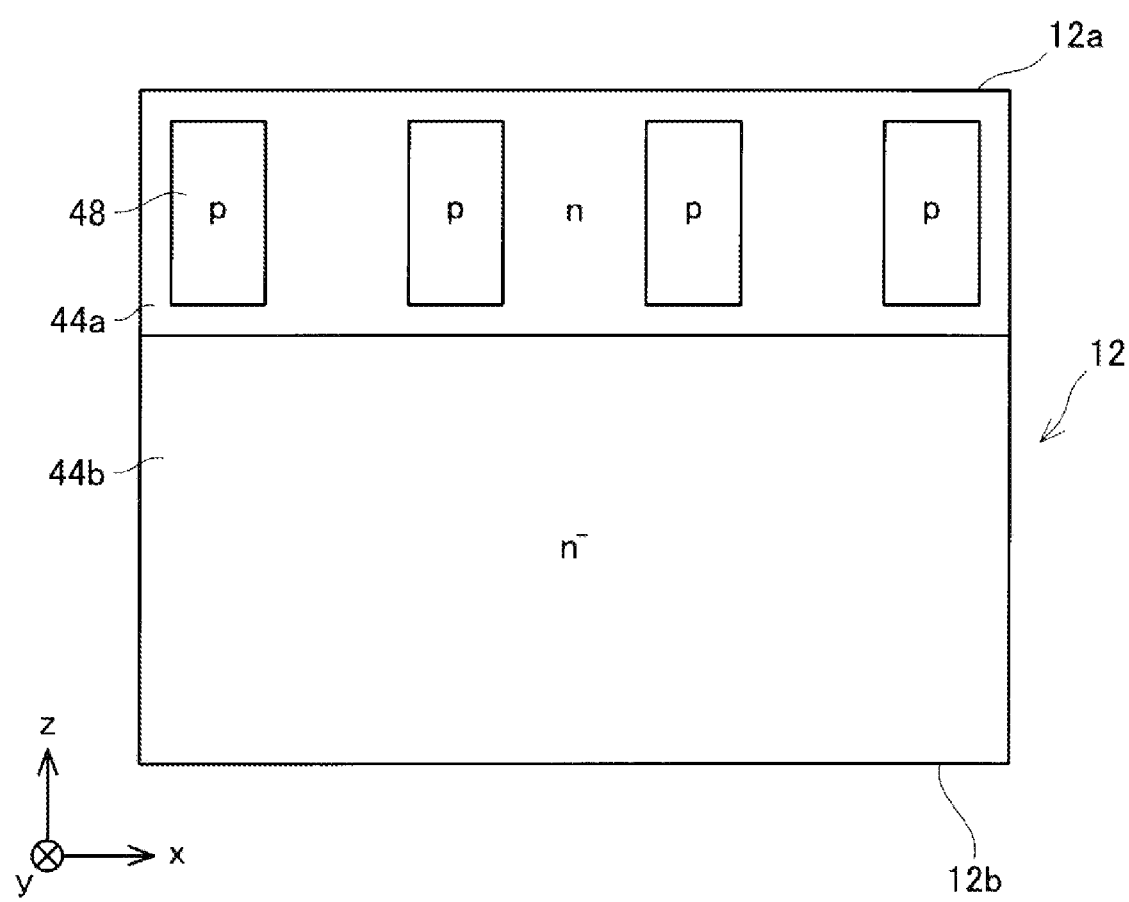
FIG. 13 is an explanatory view illustrating a modification of the method of manufacturing the MOSFET (a sectional view corresponding to FIG. 2).
Figure 14:
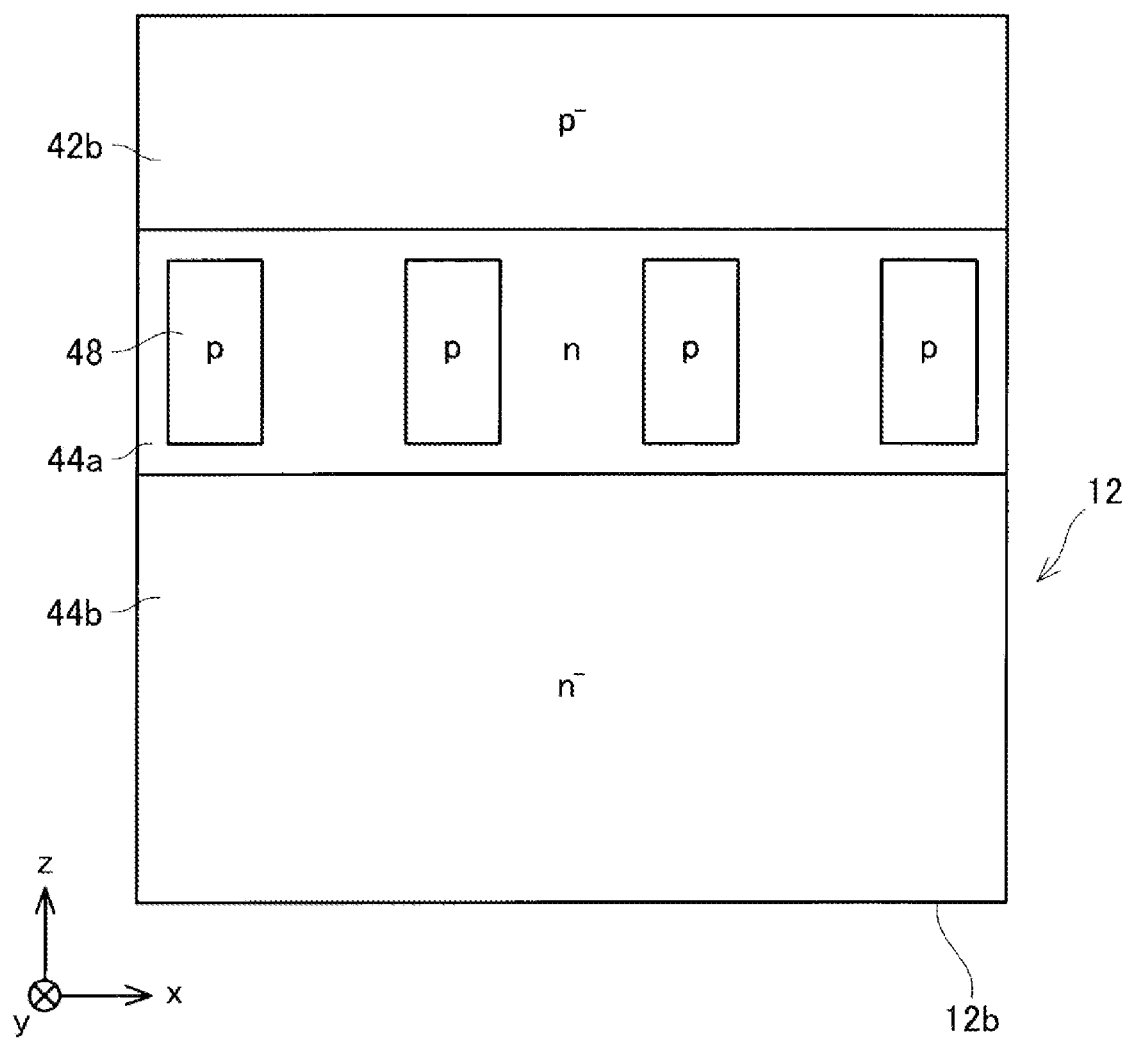
FIG. 14 is an explanatory view illustrating a modification of the method of manufacturing the MOSFET (a sectional view corresponding to FIG. 2).
Figure 15:
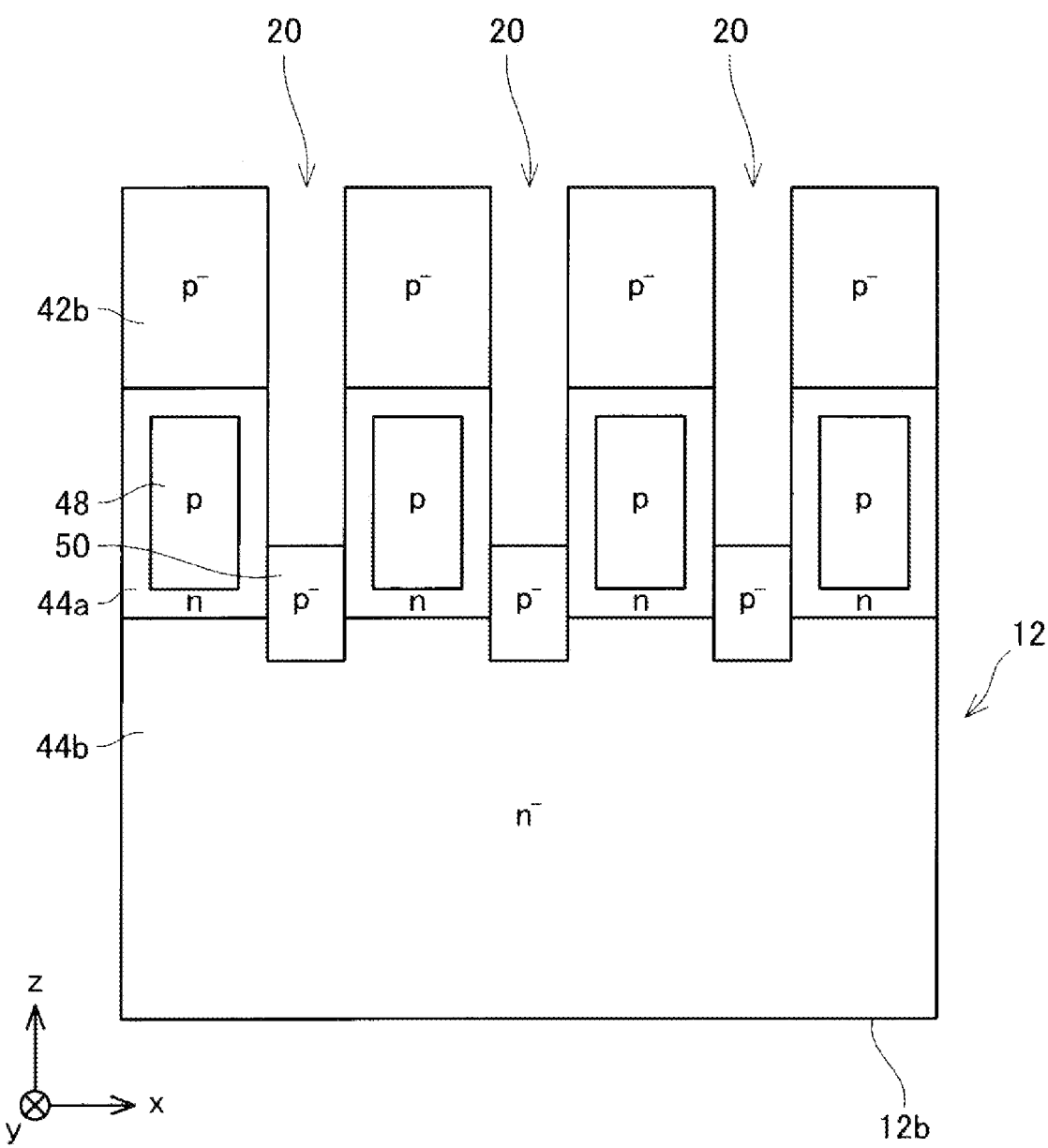
FIG. 15 is an explanatory view illustrating a modification of the method of manufacturing the MOSFET (a sectional view corresponding to FIG. 2).

In the manufacturing method described above, the low concentration region 42*b* of the body region 42 is formed by ion implantation, but the low concentration region 42*b* may be formed by epitaxial growth. In this case, as shown in FIG. 13, the breakdown voltage region 48 and the high concentration region 44*a* of the drift region 44 are formed by ion implantation in a shallow range in the vicinity of the upper surface 12*a* of the semiconductor substrate 12 before epitaxial growth. Next, as shown in FIG. 14, the low concentration region 42*b* is epitaxially grown on the semiconductor substrate 12. Next, as shown in FIG. 15, the trench 20 and the bottom region 50 are formed. Next, the gate insulating film 22, the gate electrode 24, the contact region 42*a*, the source region 40, the drain region 46, the interlayer insulating film 26, the source electrode 30, and the drain electrode 32 are formed in the same manner as in the above-described manufacturing method. Thus, the MOSFET 10 is completed.

In another manufacturing method, the breakdown voltage region 48 may be formed by ion implantation after the trench 20 is formed.

Figure 16:
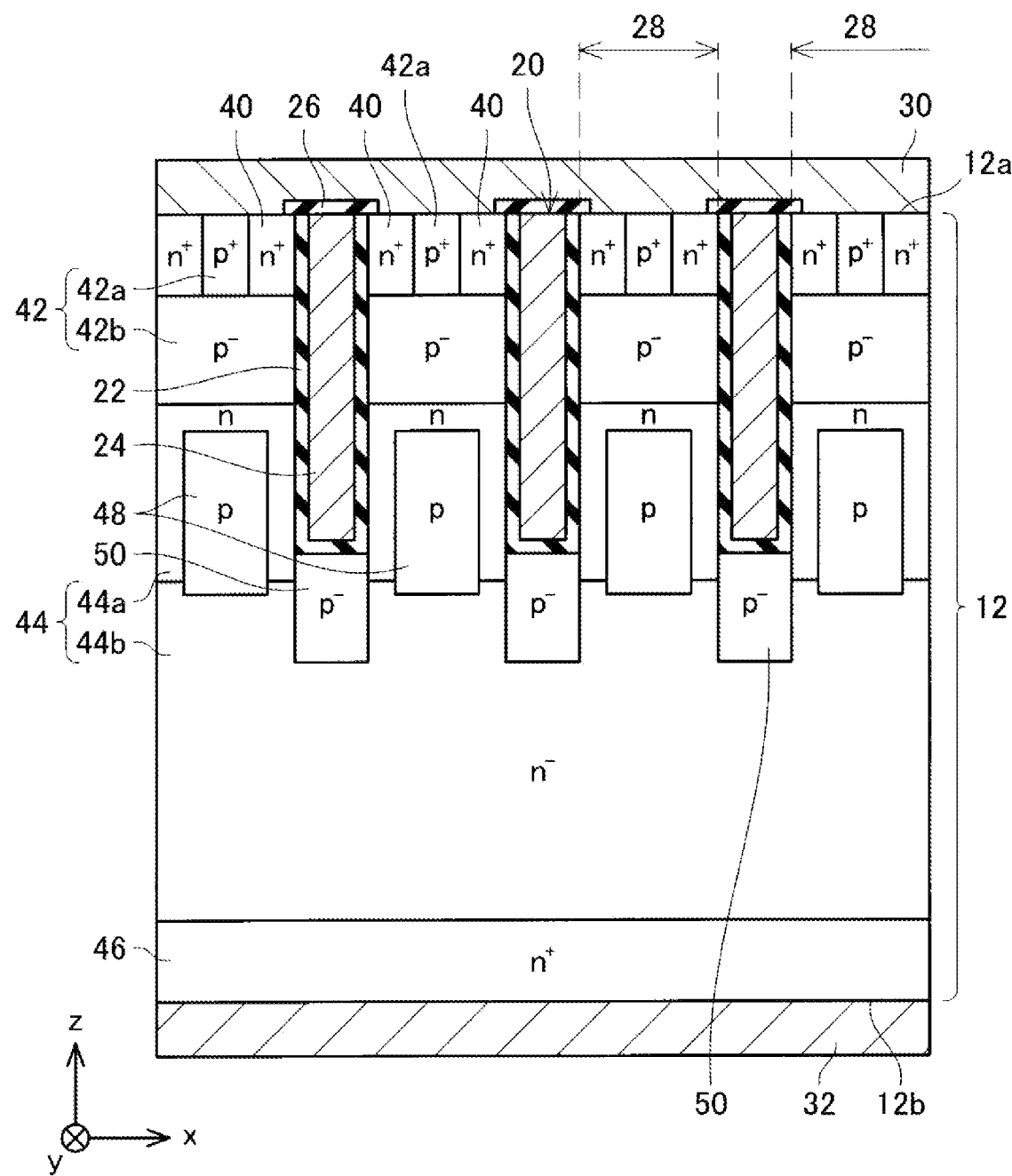
FIG. 16 is a sectional view illustrating a first modification of the MOSFET (a sectional view corresponding to FIG. 2).

In the MOSFET 10 of the embodiment, the lower end of the breakdown voltage region 48 is located above the lower end of the high concentration region 44*a*. However, as shown in FIG. 16, the breakdown voltage region 48 may reach the low concentration region 44*b*.

Figure 17:
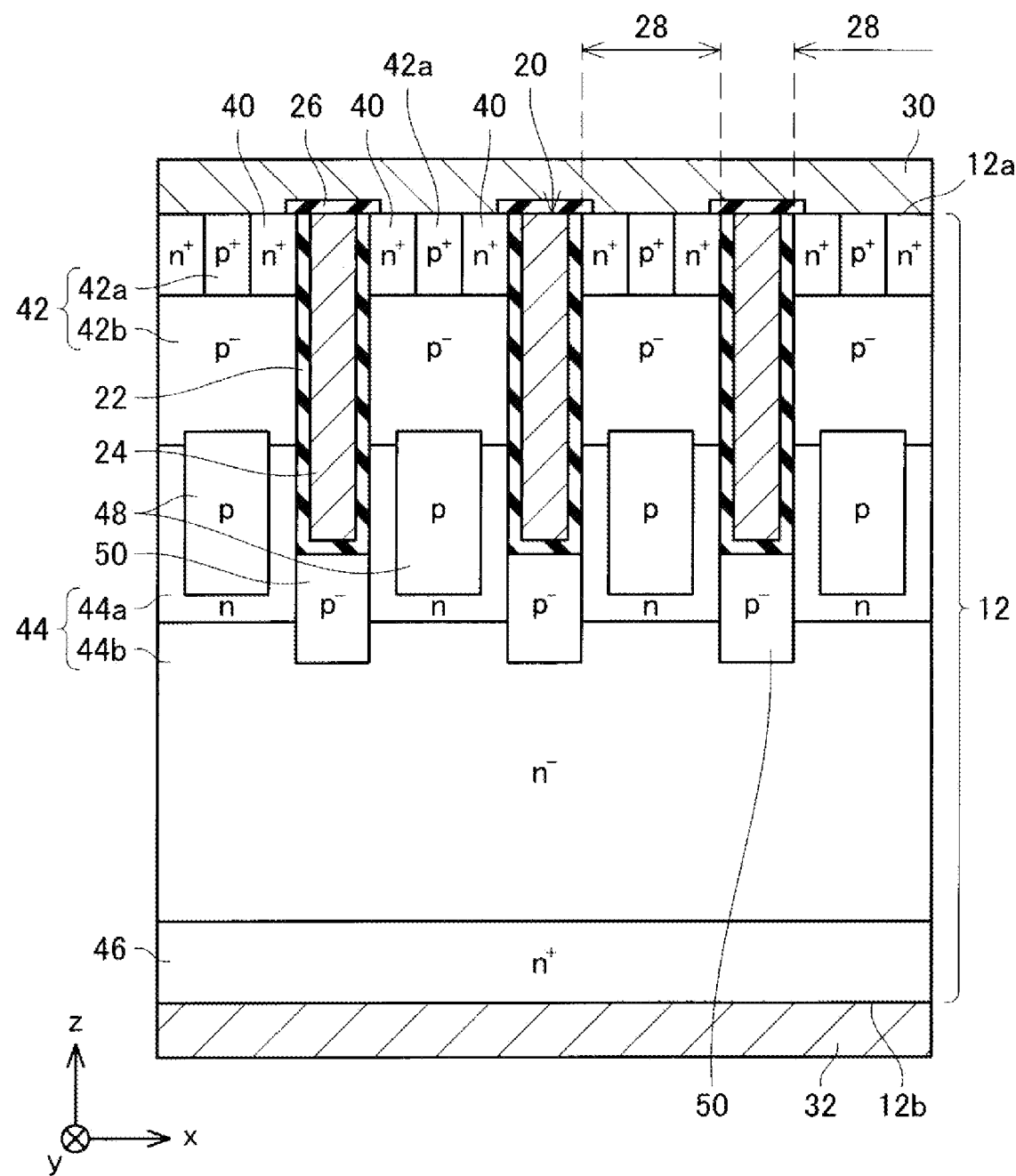
FIG. 17 is a sectional view illustrating a second modification of the MOSFET (a sectional view corresponding to FIG. 2).

In the embodiment, the breakdown voltage region 48 is separated from the body region 42. However, as shown in FIG. 17, the breakdown voltage region 48 may be connected to the body region 42.

Figure 18:
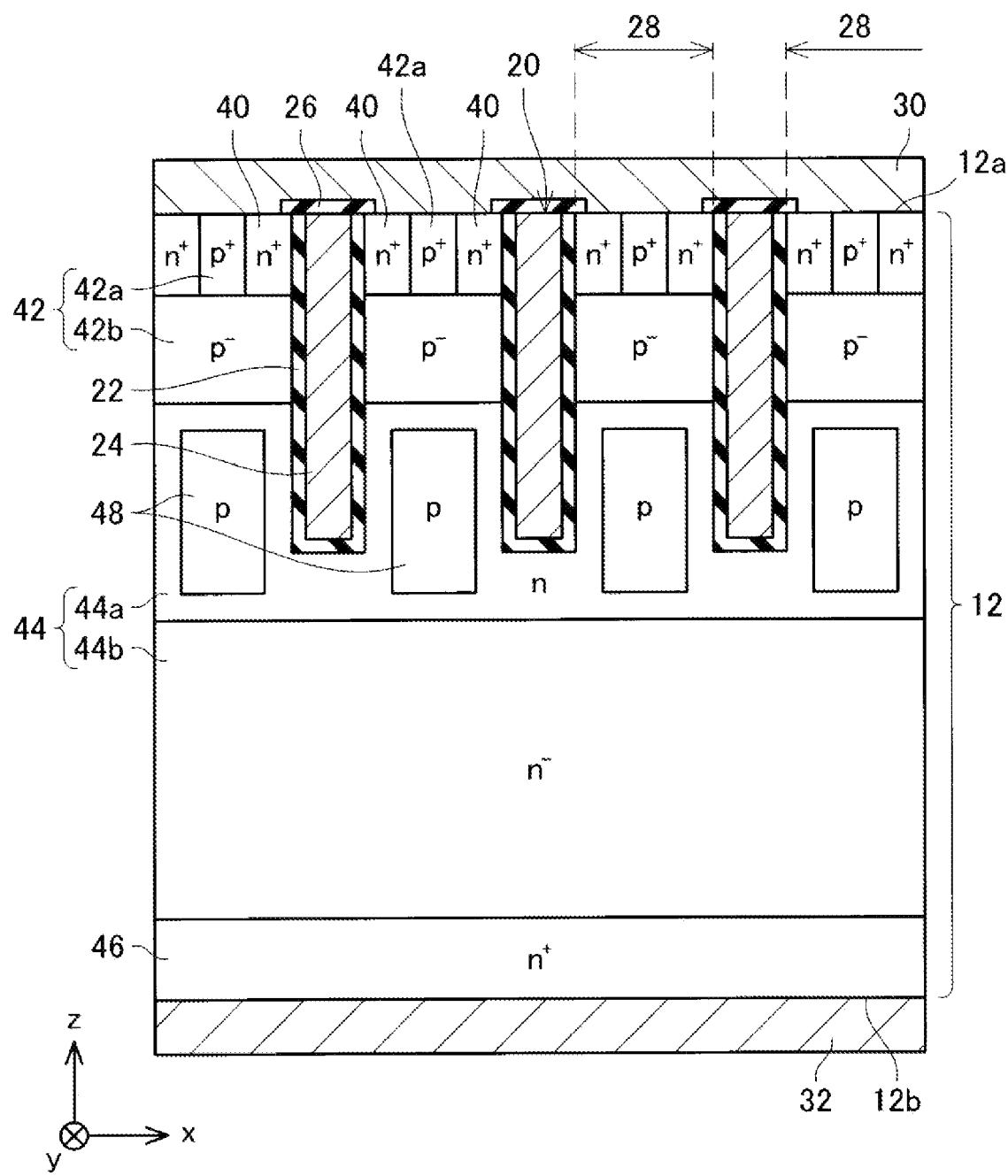
FIG. 18 is a sectional view illustrating a third modification of the MOSFET (a sectional view corresponding to FIG. 2).

In the embodiment, the bottom region 50 is provided in the lower portion of the trench 20. However, as shown in FIG. 18, the bottom region 50 may not be provided at the lower portion of the trench 20. Also in this configuration, the electric field concentration at the lower end of the trench 20 can be suppressed by the depletion layer extending from the breakdown voltage region 48.

In the embodiment, the drift region 44 includes the high concentration region 44*a* and the low concentration region 44*b*. However, the n-type impurity concentration may be uniform in the entire drift region 44.

Although the embodiments have been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A field-effect transistor comprising:
a semiconductor substrate having a plurality of trenches on an upper surface;
a gate insulating film covering an inner surface of the trench; and
a gate electrode disposed in the trench and insulated from the semiconductor substrate by the gate insulating film, wherein
the semiconductor substrate includes:
a plurality of source regions having an n-type;
a p-type body region;
an n-type drift region; and
a plurality of breakdown voltage regions having a p-type, the semiconductor substrate has an inter-trench range located between the plurality of trenches,
each of the plurality of source regions is provided in a corresponding inter-trench range and is in contact with a corresponding gate insulating film,
the body region extends over the inter-trench range, and is in contact with the gate insulating films on a lower side of the source region within the inter-trench range,
the drift region is distributed over a range from the inter-trench range to a lower side of each trench, and is in contact with the gate insulating film on a lower side of the body region,
the plurality of breakdown voltage regions is provided within the inter-trench range,
the plurality of breakdown voltage regions is provided within a range surrounded by the drift region,
the plurality of breakdown voltage regions is separated from the body region by the drift region,
the plurality of breakdown voltage regions is arranged to form a plurality of rows extending in a first direction intersecting the plurality of trenches,
in each of the rows, the plurality of breakdown voltage regions is arranged at interval in the first direction,
the plurality of rows is spaced from each other in a second direction parallel to the trench;

each of the breakdown voltage regions has a p-type impurity concentration higher than that of the body region, extends from an upper side of a lower end of each of the trenches to a lower side of the lower end of each of the trenches, and is spaced from the gate insulating film, and the drift region is in contact with the gate insulating film at a position between the breakdown voltage region and the gate insulating film.

2. The field-effect transistor according to claim 1, further comprising a plurality of p-type bottom regions, wherein each of the bottom regions has a p-type impurity concentration lower than that of each of the breakdown voltage regions, and each of the bottom regions is in contact with the gate insulating film at the lower end of a corresponding trench, and is spaced from the breakdown voltage region.

3. The field-effect transistor according to claim 1, wherein the drift region includes a low concentration region and a high concentration region having an n-type impurity concentration higher than that of the low concentration region, the high concentration region is distributed from a position in contact with the body region to a lower side of the lower end of each of the trenches, and is in contact with the gate insulating film at a position between the breakdown voltage region and the gate insulating film, and the low concentration region is in contact with the high concentration region from a lower side.

4. A method of manufacturing the field-effect transistor according to claim 1, comprising:

forming a mask extending in a lattice pattern on the upper surface of the semiconductor substrate; and forming the plurality of breakdown voltage regions in the semiconductor substrate by implanting a p-type impurity into the semiconductor substrate through the mask.

5. The method according to claim 4, further comprising:

forming the trenches on the upper surface of the semiconductor substrate; and forming the body region and a bottom region by implanting a p-type impurity into the upper surface of the semiconductor substrate and a bottom surface of the trench.

* * * * *